US007081752B2

(12) United States Patent
Skloss et al.

(10) Patent No.: US 7,081,752 B2
(45) Date of Patent: Jul. 25, 2006

(54) SYSTEM AND METHOD OF ELECTRICALLY LOADING RADIO-FREQUENCY COILS USING CONDUCTIVE POLYMERS

(75) Inventors: Timothy W. Skloss, Waukesha, WI (US); Dewain A. Purgill, Waukesha, WI (US); Roman I. Dachniwskyj, Pewaukee, WI (US); Daniel J. Schaefer, Waukesha, WI (US); Steven C. Davis, Oconomowoc, WI (US); Daniel J. Weyers, Wauwatosa, WI (US)

(73) Assignee: General Electric Company, Schenectady, NY (US)

( * ) Notice: Subject to any disclaimer, the term of this patent is extended or adjusted under 35 U.S.C. 154(b) by 50 days.

(21) Appl. No.: 10/249,390

(22) Filed: Apr. 4, 2003

(65) Prior Publication Data

US 2004/0196040 A1 Oct. 7, 2004

(51) Int. Cl.
*G01V 3/00* (2006.01)
(52) U.S. Cl. .................................... 324/318
(58) Field of Classification Search ............... 324/300, 324/307–309, 313, 314, 318–322; 600/410, 600/415, 422; 378/207, 18
See application file for complete search history.

(56) References Cited

U.S. PATENT DOCUMENTS

| | | | |
|---|---|---|---|
| 4,551,678 A | 11/1985 | Morgan et al. | |
| 4,692,704 A | 9/1987 | Gray | |
| 4,719,406 A | 1/1988 | Schaefer et al. | |
| 4,777,442 A * | 10/1988 | Rosenthal | 324/318 |
| 4,818,943 A | 4/1989 | Chandra | |
| 4,888,555 A * | 12/1989 | Vaughan et al. | 324/318 |
| 5,036,280 A | 7/1991 | Chesavage | |
| 5,055,791 A | 10/1991 | LeRoux et al. | |
| 5,071,602 A | 12/1991 | Nambu et al. | |
| 5,227,727 A | 7/1993 | Segawa et al. | |
| 5,233,992 A * | 8/1993 | Holt et al. | 600/414 |
| 5,285,787 A * | 2/1994 | Machida | 600/417 |
| 5,793,835 A | 8/1998 | Blanck | |
| 5,799,059 A | 8/1998 | Stembridge et al. | |
| 5,865,177 A * | 2/1999 | Segawa | 600/410 |
| 5,923,235 A * | 7/1999 | Van Oort | 335/301 |
| 6,018,600 A | 1/2000 | Levin et al. | |
| 6,255,816 B1 | 7/2001 | Robitaille | |
| 6,275,128 B1 * | 8/2001 | Aoki et al. | 335/299 |
| 6,275,129 B1 * | 8/2001 | van Oort | 335/301 |
| 6,304,769 B1 | 10/2001 | Arenson et al. | |
| 6,409,515 B1 | 6/2002 | Persohn et al. | |

(Continued)

OTHER PUBLICATIONS

Goodfellow web page: http://www.goodfellow.com/csp/active/static/A/CT30.HTML.*

(Continued)

*Primary Examiner*—Diego Gutierrez
*Assistant Examiner*—Dixomara Vargas
(74) *Attorney, Agent, or Firm*—Ziolkowski Patent Solutions Group, SC; Michael A. Della Penna; Carl B. Horton

(57) ABSTRACT

A system and method including an apparatus for use in electrically loading RF coils of an MRI system is disclosed. The apparatus includes a polymer interdispersed with an electrically conductive additive such that the apparatus provides the necessary electrical loading of the RF coils for testing and calibration of the MRI system but is free of liquid. Furthermore, the apparatus is capable of providing the requisite electrical load in high magnet magnetic fields without introducing image distortion as a result of standing waves within the apparatus.

38 Claims, 3 Drawing Sheets

U.S. PATENT DOCUMENTS

| | | |
|---|---|---|
| 6,490,336 B1 | 12/2002 | Suess et al. |
| 6,720,766 B1 * | 4/2004 | Parker et al. ............... 324/308 |
| 6,728,570 B1 * | 4/2004 | Kim ........................ 600/422 |
| 2004/0017196 A1 * | 1/2004 | Huang et al. .............. 324/318 |

OTHER PUBLICATIONS

Lexan ® web page: http://www.sixnetio.com/htmlhelps/datashts/m_lexan920.pdf.*

Mat Web material property data web page: http://www.matweb.com/search/SpecificMaterial.asp?bassnum=PGE8NA122.*

San Diego plastics INC. web page: http://www.sdplastics.com/polycarb.html.* http://www.infoplease.com/dictionary/Lexan.* http://www.geplastics.com/resins/pdf/26_LEXAN%20EXL.pdf.*

Cecil E Hayes; "An Adjustable RF Coil Loading Device"; Magnetic Resonance Imaging; vol. 11(1993), pp 81-86.*

* cited by examiner

SYSTEM AND METHOD OF ELECTRICALLY LOADING RADIO-FREQUENCY COILS USING CONDUCTIVE POLYMERS

BACKGROUND OF INVENTION

The present invention relates generally to a method and apparatus for testing or calibrating magnetic resonance imaging (MRI) systems. More specifically, the invention relates to a device, referred to as a loader, to electrically load RF coils of the MRI system during testing/calibration or operator training.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$ $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

During MRI operator training or when testing/calibrating the MR system, a suitable substance must be used to simulate the structures and conditions encountered in actual use of the MRI system with a patient. Specifically, properties, or "features," of human tissue must be simulated to sufficiently represent human tissue such that training in the operation of the MRI system or calibration of the system performance is possible.

One of the "features" of human tissue is its "imagability." As stated, upon proper excitation, human tissue emits NMR signals. As such, it is possible to receive and reconstruct the emitted signals into an image. Another "feature" of human tissue is electrical conductivity. The electrical conductivity serves to electrically load the RF coils of the MRI system. The load upon the RF coils is directly related to a quality factor (Q) and impedance of the RF coils. As such, load is also related to power required to conduct the scan and the amount of noise introduced into the scan. Therefore, to adequately test and calibrate the MRI system it is necessary to simulate the imagability and electrical load of human tissue.

To simulate human tissue, phantoms have been designed. A single-component phantom is designed to simulate the imagability and electrical load of human tissue with a single apparatus. Typically, in single-component phantoms, multiple fluids are enclosed in separate compartments within the phantom. A first liquid, typically water doped to raise electrical conductivity, is contained within an outer compartment. Salt is commonly used to modify the conductivity of the water. A second liquid, which is relatively non-conductive but which emits NMR signals upon excitation, is contained in an inner compartment. Therefore, a single device, containing a first fluid to provide loading and a second fluid to provide imagability, is used to test or calibrate the MR system.

However, to provide a proper simulation of human tissue it is advantageous that the phantom be comparable in size to the area of human tissue that the phantom is simulating. Therefore, it is necessary to produce relatively large phantoms. However, as the phantom is enlarged, the weight of the phantom can become overly cumbersome because the phantom is filled with two liquids.

To overcome this problem, the single-component phantom is divided into two separate devices. A first phantom, typically referred to as a "loader," is used to enclose the first, electrically conductive, liquid and a second phantom is used to enclose the second, imagable, liquid. The phantom is designed to be positioned within the loader. As such, the loader and phantom, in combination, serve to provide the electrical conductivity and imagability provided in the single-piece phantoms. The loader provides an electrical load for the RF coils and the phantom provides an imagable volume. When separated, the loader and phantom are considerably more manageable in size and weight than the singe-piece loader. Nevertheless, the loader and phantom are still quite difficult to manage and maneuver due to the liquid contained in each. Furthermore, the liquid-filled loader/phantom combinations are prone to leakage.

A second drawback to the use of either single-piece phantoms or the loader and phantom combination presents itself at high magnetic fields. Above 1.0 T, the large dielectric constant of water (roughly 80) can cause standing wave effects in the water. These standing waves cause a non-uniform RF field inside the phantom even though the RF field applied by the RF coils is uniform. The standing waves, though unrelated to RF coil loading, introduce distortion to the image of the phantom. This deterioration in image quality hinders proper testing or calibration of the imaging system.

Previous attempts at solving this problem include the use of silicone oil, which has a dielectric constant of roughly 5, to replace the water in the phantom and/or loader. However, silicone oil is costly to effectively dope. To achieve the desired electrical conductivity, high concentrations of costly silver powder are required. However, this solution requires the use of a liquid, which can have leakage concerns.

It would therefore be desirable to have a loader with a low dielectric constant and a relatively high electrical conductivity that is effective at high magnetic fields. It would also be desirable to limit the size and weight of the loader to facilitate placement and removal of the loader in the RF coils. Furthermore, it would be advantageous for the loader to be free of liquid, thus, reducing the cost of production and maintenance, and eliminating leakage.

BRIEF DESCRIPTION OF INVENTION

The present invention provides a system and method of electrically loading RF coils of an MRI system using conductive polymers. A loader constructed of a polymer having a low dielectric constant but that is sufficiently electrically conductive to effectively load RF coils of an MRI system, is described. Specifically, the loader is constructed of an electrically conductive polymer created by compounding a base polymer matrix with electrically conductive additives. The loader, which is free of liquid, is effective at high magnetic fields.

In accordance with one aspect of the invention, an apparatus to electrically load RF coils is disclosed. The apparatus includes a loader constructed of an electrically conductive additive interdispersed within a polymer. Furthermore, the loader is free of liquid.

In accordance with another aspect of the invention, a method of constructing a loader for use with an MR apparatus is disclosed. The method includes constructing the loader by liquefying a base polymer matrix and compounding the liquefied base polymer matrix with an electrically conductive additive. The process next includes, dispersing the electrically conductive additive within the liquefied base polymer matrix and forming the loader for use in loading RF coils of the MR apparatus.

In accordance with another aspect of the invention, a method of calibrating an MR system is disclosed. The method includes positioning a loader, constructed of an electrically conductive polymer, within an RF coil assembly. A phantom is then situated within the RF coil assembly and a calibration scan can be conducted.

In accordance with another aspect of the invention, an MRI apparatus is disclosed. The MRI system has a plurality of gradient coils positioned about a bore of a magnet to impress a polarizing magnetic field. An RF transceiver system and an RF switch are controlled by a pulse module to transmit and receive RF signals to and from an RF coil assembly to acquire MR images. A loading apparatus is provided to electronically load the RF coil assembly and is constructed of an electrically conductive additive interdispersed in a polymer.

Various other features, objects and advantages of the present invention will be made apparent from the following detailed description and the drawings.

BRIEF DESCRIPTION OF DRAWINGS

The drawings illustrate one preferred embodiment presently contemplated for carrying out the invention.

In the drawings.

DETAILED DESCRIPTION

Figure 1:
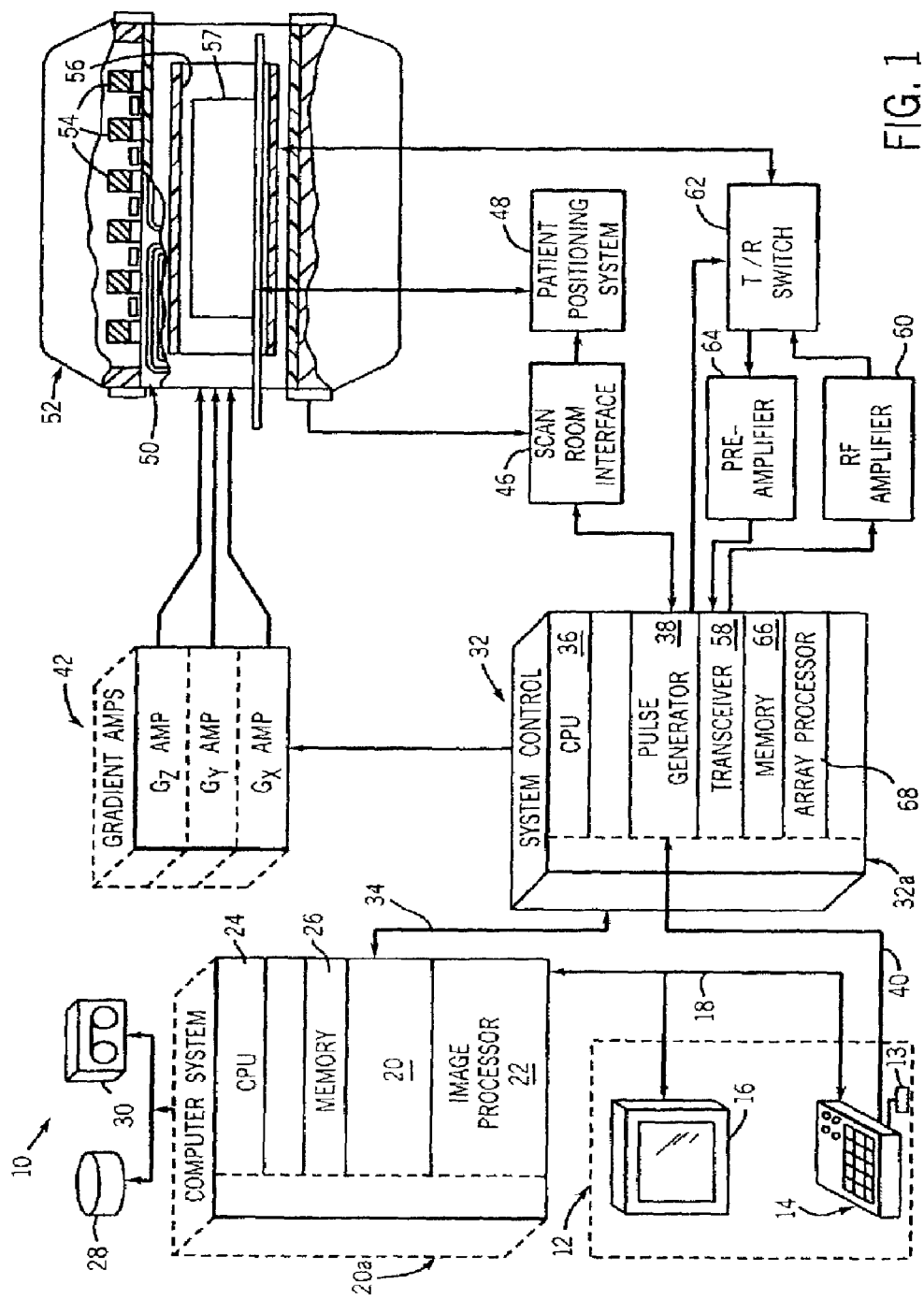
FIG. 1 is a schematic block diagram of an MR imaging system for use with the present invention.

Referring to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. As will be described in detail, a loader 57 electrically loads the RF coil 56. A phantom (not shown) may be disposed within the loader 57 to provide an imagable substance. A transceiver module 58 in the system control 32 produces pulses which are amplified by an RF amplifier 60 and coupled to the RF coil 56 by a transmit/receive switch 62. If a phantom is used, the resulting signals emitted by the excited nuclei in the phantom may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

Figure 2:
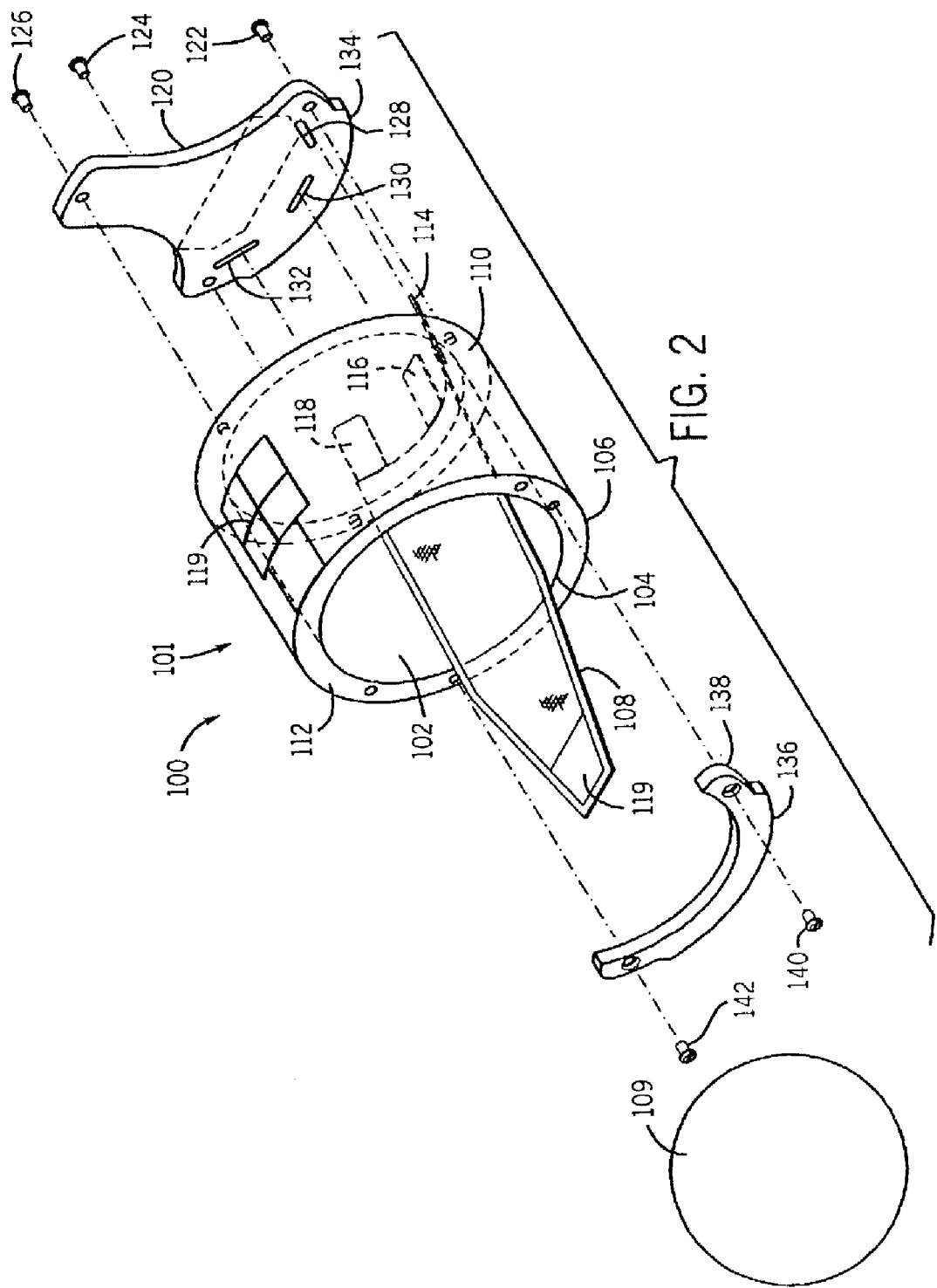
FIG. 2 is an exploded perspective view of a loader assembly in accordance with the present invention.

Referring now to FIG. 2, a loader assembly 100 is shown in an exploded view. The loader assembly 100 includes a cylindrical loader 101. The cylindrical loader 101 is constructed by liquefying a base polymer matrix and physically combining an electrically conductive additive within the liquefied base polymer matrix. Therefore, the electrically conductive additive is interdispersed in the base polymer matrix such that, upon solidification of the liquefied base polymer matrix an electrically conductive polymer is created. The base polymer matrix has a low dielectric constant and the electrically conductive additive has a relatively high conductivity. Preferably, the base polymer has a dielectric constant of less than 5. Such dielectric constant is low when compared with that of water and silicone oil, which have dielectric constants of 80 and 5 respectively. Furthermore, the electrically conductive additive has a conductivity of approximately 2 siemens/meter. It is contemplated that the electrically conductive additive may be metal fibers, carbon powder, carbon fibers, carbon nano-tubes or other suitable electrically conductive substances. As such, it is possible to construct a loader having a low dielectric constant and relatively high electrical conductivity that is solid. That is, it is possible to construct a loader that is free of liquid. Furthermore, the solid loader can be constructed to be considerably smaller than loaders which require the use of doped liquids to provide a suitable loading apparatus. In accordance with one embodiment, the polymer is solidified to form a foam loader. As such, it is possible to further reduce the weight of the loader.

The cylindrical loader 101 has a hollow center 102 and solid outer skeleton structure between an inner cylinder perimeter 104 and an outer cylinder perimeter 106. Secured within the hollow center 102 is a fastening net 108. The fastening net 108 is provided as a means for restricting movement of a phantom 109, which may be of many various shapes and sizes. In a preferred embodiment, the fastening net 108 can be formed of a cloth or any other netting material. However, any suitable device may be used to enclose the hollow center 102. The fastening net 108 extends from a rear 110 of the cylindrical loader 101 to a front 112 of the cylindrical loader 101. The fastening net 108 is secured at the rear 110 of the cylindrical loader 101 by securing the fastening net 108 to tabs 114, 116, 118 that extend laterally from the rear 110 of the cylindrical loader 101. In one embodiment, the fastening net 108 is secured to tabs 114, 116, 118 by extending tabs 114, 116, 118 through openings in the fastening net 108. The fastening net 108 is also capable of being secured at the front 112 of the cylindrical loader 101 by a fastener 119 capable of repeated fastening/unfastening. It is contemplated that buckles, snaps, hooks, slides, zippers, Velcro® or other suitable fastening means may be employed to fasten the fastening net 108. Velcro® is a registered trademark of Velcro Industries, Antilles, Netherlands. In a preferred embodiment, the fastener 119 is attached to the outer cylinder perimeter 106 and on an end of the fastening net 108 that is opposite of an end secured by the tabs 114, 116, 118. Alternatively, it is contemplated that the fastener 119 may be positioned on the front 112 of the cylindrical loader 101, on the inner cylinder perimeter 104, or on any other part of the loader assembly 100 such that the phantom 109 is relatively secured inside the cylindrical loader 101.

A rear retainer 120 is secured to the rear 110 of the cylindrical loader 101 by fasteners 122, 124, 126. The rear retainer 120 is configured to engage the tabs 114, 116, 118 at openings 128, 130, 132. As such, the fastening net 108 may be secured from disengaging the tabs 114, 116, 118. Furthermore, the rear retainer 120 restricts phantom movement in the hollow center 102 from the rear 110 of the cylindrical loader 101. Therefore, when the phantom 109 is placed within the hollow center 102, it cannot be removed from the rear 110 of the cylindrical loader 101. To allow entry or exit of the phantom 109 from the loader assembly 100, fastening net 108 must be unfastened by disengaging the fastener 119. Therefore, the phantom 109 must enter or exit the loader assembly 100 from the front 112 of the cylindrical loader 101. That is, the fastening net 108 must be fastened or unfastened at fastener 119 to restrict or allow movement of the phantom 109, respectively.

The rear retainer 120 is constructed of a polymer suitable to provide the necessary support and restrict the movement of the phantom 109. In one embodiment, the rear retainer 120 may be constructed of a polymer interdispersed with an electrically conductive additive. It is further contemplated that rear retainer 120 may be designed such that air flow through the hollow portion is permitted or restricted. As such, it is contemplated that the rear retainer 120 may be constructed of an alternative material such as cloth or netting.

The rear retainer 120 also includes a first support lobe 134. When the rear retainer 120 is secured against the rear 110 of the cylindrical loader 101 by fasteners 122, 124, 126, the first support lobe 134 extends past the outer cylinder perimeter 106. Similarly, a second support lobe 136 extends from a front support 138 such that the second support lobe 136 extends past outer cylinder perimeter 106 when front support 138 is secured to the front 112 of the cylindrical loader 101 by fasteners 140, 142. Therefore, the loader 57 can be placed such that the first support lobe 134 and the second support lobe 136 support the cylindrical loader 101.

Figure 3:
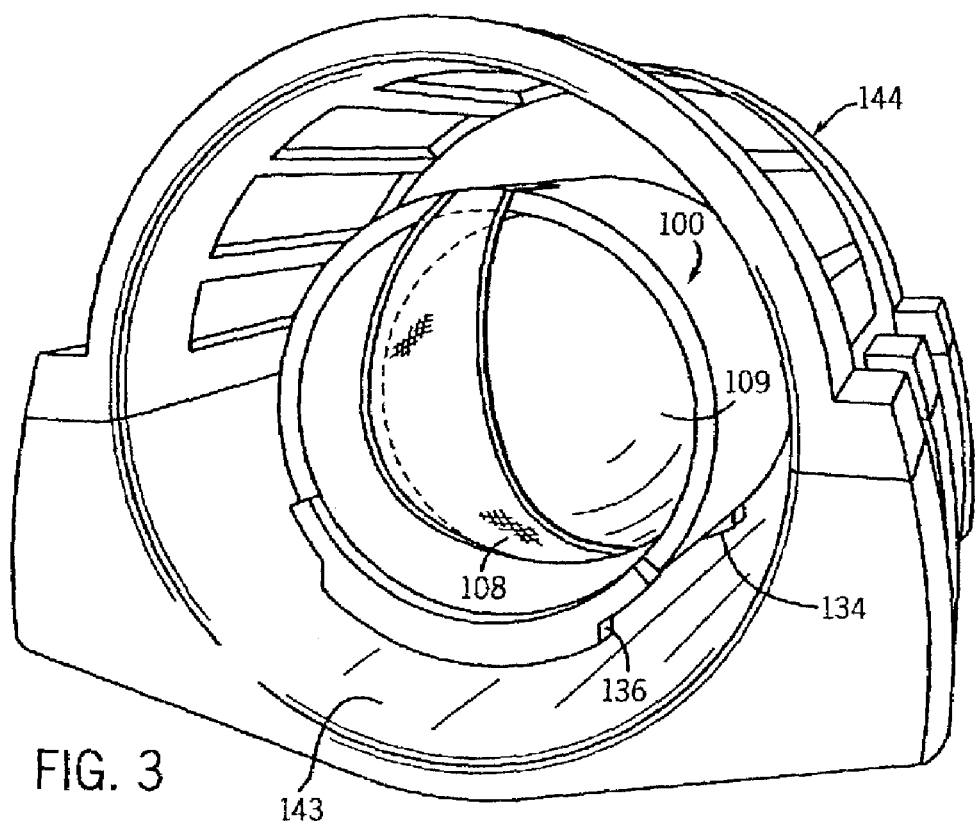
FIG. 3 is a perspective view of the loader of FIG. 2 within an RF coil assembly of FIG. 1 and having a phantom centered therein.

Referring now to FIG. 3, the loader assembly 100 is shown positioned within a RF coil assembly 144. The loader is supported by the first support lobe 134 and the second support lobe 134. The first support lobe 134 and the second support lobes 136 engage a bed 146 of the RF coil assembly 144 such that the loader is positioned above the bed 146. Furthermore, the phantom 109 is positioned within the loader assembly 100. In a preferred embodiment the loader assembly 100 and the phantom 109 are independent. However, it is contemplated that the loader assembly 100 and the phantom may be integrally connected. Furthermore, in a preferred embodiment, the phantom 109 is spherical. However, it is contemplated that the phantom may be any shape capable of being positioned or integrated within the loader. A fastening portion 210 is secured to the loader assembly 100 such that the phantom is secured between a rear retainer (now shown) and the faster 108.

Upon energizing the RF coil assembly 144, the loader assembly 100 provides an electrical load for the RF coil assembly 144, while the phantom 109 provides an imagable substance such that the MR system may be tested and/or calibrated, or operators may be trained using the arrangement. Typically, fluid, which is enclosed within the phantom and is relatively non-conductive, emits NMR signals upon excitation. Therefore, the phantom 109 is imagable while the loader assembly 100 is not. As such, the loader assembly 100 simulates the RF coil assembly load of human tissue and the phantom 109 simulates the imagability of human tissue. Furthermore, the loader assembly 100 is liquid free and therefore, significantly reduced in size and weight as compared to liquid filled loaders.

The reduction in size and weight of the loader allows the loader to be more maneuverable than loaders containing liquid. Furthermore, the liquid-free loader permits testing/ calibration of the RF coil at high magnetic fields. Specifically, fields above 1.0 T and 1.5 T can be used for testing and/or calibration, or training of operators without the introduction of distortion into the image of the phantom as a result of standing waves within the loader.

Figure 4:
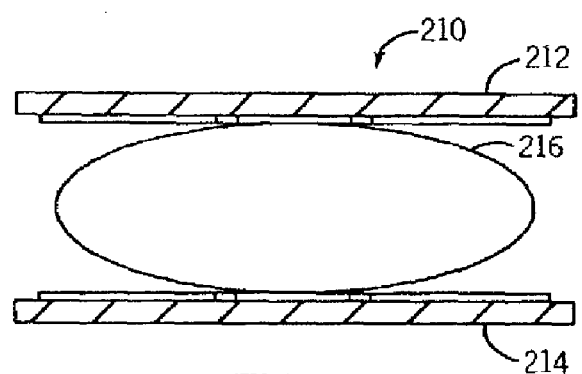
FIG. 4 is a side view of a loader in accordance with one aspect of the present invention.

Referring now to FIG. 4, a loader 210, in the form a sheet and constructed of a foam, is shown. While not ideal in all applications, the foam loader may be used in conjunction with planar RF coil configurations. The sheet loader 210 includes a first sheet 212 and a second sheet 214. The first sheet 212 and the second sheet 214 are constructed of an electrically conductive foam. Therefore, the sheet loader 210 is constructed by liquefying a polymer, physically combining an electrically conductive additive within the liquefied polymer, and solidifying the polymer into a foam. Therefore, the electrically conductive additive is interdispersed in the polymer such that, upon solidification of the liquefied polymer, an electrically conductive foam is created. The foam has a low dielectric constant and the electrically conductive additive has a relatively high conductivity. The use of a conductive foam allows a further reduction in weight, even when compared to loaders constructed of a solid electrically conductive polymer, as in the previously described embodiments.

A phantom 216 is placed between the first sheet 212 and the second sheet 214 of sheet loader 210. The phantom 216 is elliptical. However, it is contemplated that the phantom may be any shape capable of being positioned between the first sheet 212 and the second sheet 214.

As stated, the sheet loader 210 may be used in conjunction with planar RF coil configurations. Upon energizing the planer RF coil assembly, the sheet loader 210 provides an electrical load for the planar RF coil assembly while the phantom 216 provides an imageable substance such that the MR system may be tested and/or calibrated, or operators may be trained using the arrangement. Typically, fluid, which is enclosed within the phantom and is relatively non-conductive, emits NMR signals upon excitation. Therefore, the phantom 216 is imageable while the sheet loader 210 is not. As such, the sheet loader 210 simulates the RF coil assembly load of human tissue and the phantom 216 simulates the imagability of human tissue.

It should be recognized that the figures have been described with respect to specific embodiments. That is, while the characteristics of a specific construction material may be preferred for a given embodiment, the construction material is not dictated by the loader configuration. Therefore, sheet loaders may also be constructed of a solid conductive polymer and cylindrical loaders may be constructed of a conductive foam.

It is contemplated that the above invention can be embodied in an apparatus for use in an electrically loading RF coils including a loader. The loader is constructed of an electrically conductive additive interdispersed in a polymer such that the loader is free of liquid.

It is also contemplated that the invention described above be embodied as a method of constructing a loader for the use with an MR apparatus. The method including liquefying a base polymer matrix and compounding the liquefied base polymer matrix with an electrically conductive additive. The method further including dispersing the electrically conductive additive within the liquefied base polymer matrix and forming a loader for use in loading RF coils of the MR apparatus.

It is further contemplated that the invention described above be embodied as a method of calibrating an MR system. The method including positioning a loader constructed of an electrically conductive polymer within an RF coil assembly and positioning a phantom within the RF coil assembly. The method further includes conducting a calibration scan.

It is also contemplated that the invention described above be embodied as an MRI apparatus. The MRI apparatus includes a MRI system having a plurality of gradient coils positioned about a bore of a magnet to impress a polarizing magnetic field and an RF transceiver system and an RF switch controlled by a pulse module to transmit RF signals to an RF coil assembly to acquire MR images. The MRI apparatus also includes a loading apparatus to electrically load the RF coil assembly. The loading apparatus constructed of an electrically conductive additive interdispersed within a polymer.

The present invention has been described in terms of the preferred embodiment, and it is recognized that equivalents, alternatives, and modifications, aside from those expressly stated, are possible and within the scope of the appending claims.

What is claimed is:

1. An apparatus comprising:
   a loader comprised of an electrically conductive additive interdispersed in a polymer wherein the loader is free of liquid; and
   wherein the loader is constructed to electrically load RF coils.
2. The apparatus of claim 1 wherein the electrically conductive additive is at least one of metal fibers, carbon powder, carbon fibers, and carbon nano-tubes.
3. The apparatus of claim 1 wherein the polymer has a low dielectric constant and the electrically conductive additive has relatively high electrical conductivity.
4. The apparatus of claim 3 wherein the dielectric constant is less than 5.
5. The apparatus of claim 1 wherein the loader is cylindrically shaped.
6. The apparatus of claim 1 wherein the loader is a sheet.
7. The apparatus of claim 1 wherein the polymer forms a foam.
8. The apparatus of claim 1 wherein the loader has a hollow center and is configured to retain a phantom disposed therein.
9. The apparatus of claim 8 wherein the phantom has a liquid therein and is removable from the loader.
10. The apparatus of claim 8 wherein the phantom is integrally disposed within the loader.
11. The apparatus of claim 1 wherein the loader is positioned within an RF coil.
12. The apparatus of claim 11 wherein the loader and RF coil are positioned within a MRI apparatus.
13. The apparatus of claim 1 further comprising a loader assembly having the loader therein and wherein the loader assembly has a first and a second end and a retainer positioned at the first end to restrict movement of a phantom therethrough.
14. The apparatus of claim 13 wherein the loader assembly further comprises a fastener removably fastenable to the second end to restrict the phantom.
15. The apparatus of claim 1 wherein the apparatus further comprises front and rear supports connected to an outer diameter of the loader and each support having thereon an outwardly extending lobe to support the loader.
16. A method of constructing a loader for use with a MR apparatus comprising the steps of:
   compounding a base polymer matrix with an electrically conductive additive;

dispersing the electrically conductive additive within the base polymer matrix; and forming a loader for use in loading RF coils of the MR apparatus.

17. The method of claim 16 further comprising forming the loader as a hollow cylinder to receive therein a phantom.

18. The method of claim 16 further comprising the step of forming a phantom integrally with the loader.

19. The method of claim 16 wherein the electrically conductive additive includes at least one of metal fibers, carbon powder, carbon fibers, and carbon nano-tubes.

20. The method of claim 16 wherein the base polymer matrix has a low dielectric constant and the electrically conductive additive has a relatively high electrical conductivity.

21. The method of claim 20 wherein the dielectric constant of the base polymer matrix is low enough to reduce distortion within an image.

22. The method of claim 16 further comprising farming the loader as a sheet.

23. The method of claim 16 further comprising liquefying the base polymer matrix to compound the base polymer matrix with the electrically conductive additive and solidifying the liquefied base polymer matrix and the electrically conductive additive to form a foam.

24. A method of calibrating a MR system comprising:
positioning a loader constructed of an electrically conductive polymer within an RF coil assembly;
positioning a phantom within the BF coil assembly; and
conducting a calibration scan.

25. The method of claim 24 further comprising generating a high magnetic field when conducting the calibration scan.

26. The method of claim 24 wherein the electrically conductive polymer has a low dielectric constant and a relatively high conductivity.

27. The method of claim 24 wherein the electrically conductive polymer reduces standing wave distortion within an image of the phantom.

28. The method of claim 24 wherein the electrically conductive polymer comprises at least one electrically conductive additive and a polymer of dielectric constant low enough to reduce standing waves within the phantom during the calibration scan.

29. The method of claim 28 wherein the at least one electrically conductive additive is at least one of metal fibers, carbon powder, carbon fibers, and carbon nano-tubes.

30. The method of claim 24 wherein the phantom is integral within the loader.

31. An MRI apparatus comprising:
a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil assembly to acquire MR images; and
a loading apparatus to electrically load the RF coil assembly comprised of an electrically conductive additive interdispersed in a polymer.

32. The MRI apparatus of claim 31 wherein the electrically conductive additive is selected from at least one of metal fibers, carbon powder, carbon fibers, and carbon nano-tubes.

33. The MRI apparatus of claim 31 wherein the electrically conductive additive has a relatively high conductivity and the polymer has a dielectric constant low enough to reduce distortion within an acquired MR image.

34. The MRI apparatus of claim 31 wherein the loading apparatus forms a hollow cylinder.

35. The MRI apparatus of claim 31 further comprising a phantom disposed within the loading apparatus.

36. The MRI apparatus of claim 35 wherein the phantom is imagable by the MRI system and the loading apparatus is not imagable by the MRI system.

37. The MRI apparatus of claim 31 wherein the magnet is one that generates high magnetic fields and is at least a 1.5 T magnet.

38. The MRI apparatus of claim 31 wherein the loading apparatus further comprises a solid outer skeleton structure.

* * * * *

UNITED STATES PATENT AND TRADEMARK OFFICE
CERTIFICATE OF CORRECTION

PATENT NO. : 7,081,752 B2  Page 1 of 1
APPLICATION NO. : 10/249390
DATED : April 4, 2003
INVENTOR(S) : Skloss et al.

It is certified that error appears in the above-identified patent and that said Letters Patent is hereby corrected as shown below:

Col. 9, line 19 (Claim 22), delete "farming" and substitute therefore -- forming --;
line 29 (Claim 24), delete "BF" and substitute therefore -- RF --.

Signed and Sealed this

Twenty-first Day of November, 2006

JON W. DUDAS
*Director of the United States Patent and Trademark Office*

UNITED STATES PATENT AND TRADEMARK OFFICE
CERTIFICATE OF CORRECTION

PATENT NO.        : 7,081,752 B2
APPLICATION NO.   : 10/249390
DATED             : July 25, 2006
INVENTOR(S)       : Skloss et al.

It is certified that error appears in the above-identified patent and that said Letters Patent is hereby corrected as shown below:

Col. 9, line 19 (Claim 22), delete "farming" and substitute therefore -- forming --;
      line 29 (Claim 24), delete "BF" and substitute therefore -- RF --.

This certificate supersedes Certificate of Correction issued November 21, 2006.

Signed and Sealed this

Second Day of January, 2007

JON W. DUDAS
*Director of the United States Patent and Trademark Office*